United States Patent [19]
Shin

[11] Patent Number: 5,990,529
[45] Date of Patent: *Nov. 23, 1999

[54] SEMICONDUCTOR MEMORY DEVICE WITH IMPURITY AREAS AROUND TRENCH STRUCTURE

[75] Inventor: Bong-Jo Shin, Choongcheongbuk-Do, Rep. of Korea

[73] Assignee: LG Semicon Co., Ltd., Cheongju, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 08/773,510

[22] Filed: Dec. 23, 1996

[30] Foreign Application Priority Data

Dec. 30, 1995 [KR] Rep. of Korea .................... 95-68660

[51] Int. Cl.$^6$ ................... H01L 29/76; H01L 29/94; H01L 31/062; H01L 31/119
[52] U.S. Cl. ................... 257/408; 257/336; 257/397; 257/390; 438/262
[58] Field of Search .................... 257/336, 397, 257/408, 390; 438/270, 262

[56] References Cited

U.S. PATENT DOCUMENTS

| | | | |
|---|---|---|---|
| 5,278,438 | 1/1994 | Kim et al. ................... | 257/316 |
| 5,306,941 | 4/1994 | Yoshida ................... | 257/390 |
| 5,308,781 | 5/1994 | Yuichi et al. ................... | 437/48 |
| 5,424,231 | 6/1995 | Yang ................... | 438/270 |
| 5,424,569 | 6/1995 | Prall ................... | 257/324 |
| 5,436,488 | 7/1995 | Poon et al. ................... | 257/397 |
| 5,650,340 | 7/1997 | Burr et al. ................... | 437/30 |

*Primary Examiner*—Olik Chaudhuri
*Assistant Examiner*—Howard Weiss
*Attorney, Agent, or Firm*—Fleshner & Kim

[57] ABSTRACT

A semiconductor device and a fabrication method thereof which are capable of achieving a lightly doped drain (LDD) construction and reducing a parasitic capacitance generated between an impurity area and a word line by forming a trench in a portion of a semiconductor substrate and forming impurity areas around the trenches, include a semiconductor substrate, a plurality of trenches formed in the semiconductor substrate, first impurity areas formed along the outer surfaces of the plurality of trenches, second impurity areas formed on the bottom surfaces of the first impurity areas along the outer surfaces of the trenches, an insulating film filled in the trenches, a gate insulating film formed at a regular interval on the substrate having the insulating film filled in the trenches, and a gate electrode formed on the gate insulating film.

20 Claims, 4 Drawing Sheets

SEMICONDUCTOR MEMORY DEVICE WITH IMPURITY AREAS AROUND TRENCH STRUCTURE

BACKGROUND OF THE INVENTION

1. Field of the Invention

The present invention relates to a semiconductor memory device and a fabrication method thereof, and in particular, to an improved semiconductor memory device and a fabrication method thereof which is capable of achieving a lightly doped drain (LDD) construction and reducing a parasitic capacitance generated between an impurity area and a word line by forming a trench in a portion of a semiconductor substrate and forming an impurity area around the trench.

2. Description of the Prior Art

FIG. 1 is a plan view of a layout of a semiconductor memory device according to the conventional art, and FIG. 2 is a longitudinal cross-sectional view of the semiconductor memory device in FIG. 1. As shown in these drawings, a semiconductor substrate 1 is formed having a plurality of (N+) impurity areas (2s,2d) on the upper portion thereof 1, and on the plurality of impurity areas (N+) (2s,2d), a gate oxide film 3 is formed. On the gate oxide film 3, a plurality of polysilicon lines 4 are sequentially formed. The polysilicon lines 4 which serve as word lines are formed to cross the plurality of (N+) impurity areas (2s,2d). And, a polysilicide layer 5 is formed on the polysilicons 4.

In the above-described semiconductor memory device according to the conventional art, since as many capacitors as the (N+) impurity areas (2s,2d) (which are parasitic capacitors) are formed between the (N+) impurity areas (2s,2d) and the polysilicon lines 4 formed on the semiconductor substrate 1, the delay time of the word lines is disadvantageously increased due to the parasitic capacitors, and it is difficult to reduce the size of a cell due to a lateral diffusion of the (N+) impurity areas (2s,2d). Furthermore, since the (N+) impurity areas (2s,2d) serve as the source and drain of a transistor, a semiconductor memory device having the LDD construction is impossible to fabricate.

SUMMARY OF THE INVENTION

Accordingly, it is an object of the present invention to provide an improved semiconductor memory device and a fabrication method thereof which is capable of lessening the parasitic capacitance formed due to polysilicon and (N+) impurity areas.

It is another object of the present invention to provide an improved semiconductor memory device and a fabrication method thereof which is capable of fabricating a semiconductor memory device having an LDD construction.

It is still another object of the present invention to provide an improved semiconductor memory device and a fabrication method thereof which is capable of reducing the size of a memory cell of a semiconductor device by preventing a lateral diffusion of an impurity area on a semiconductor substrate.

To achieve the above object, there is provided an improved semiconductor memory device which includes a semiconductor substrate, a plurality of trenches formed in the semiconductor substrate, first impurity areas formed along the outer surfaces of each of the plurality of trenches, second impurity areas formed under a bottom surfaces of each first impurity area along the outer surfaces of the trenches, an insulating film filled in each trench, a gate insulating film formed at a regular interval on the substrate having the insulating film filled in the trench, and a gate electrode formed on the gate insulating film.

To achieve the above object, there is provided an improved fabrication method for a semiconductor memory device which includes the steps of forming a plurality of trenches in a semiconductor substrate, forming a first impurity area around each trench, forming a second impurity area beneath each first impurity area, filling the trenches with an insulating film, forming a gate insulating film at a regular interval on the substrate having the insulating film filled in the trenches, and forming a gate electrode on the gate insulating film.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
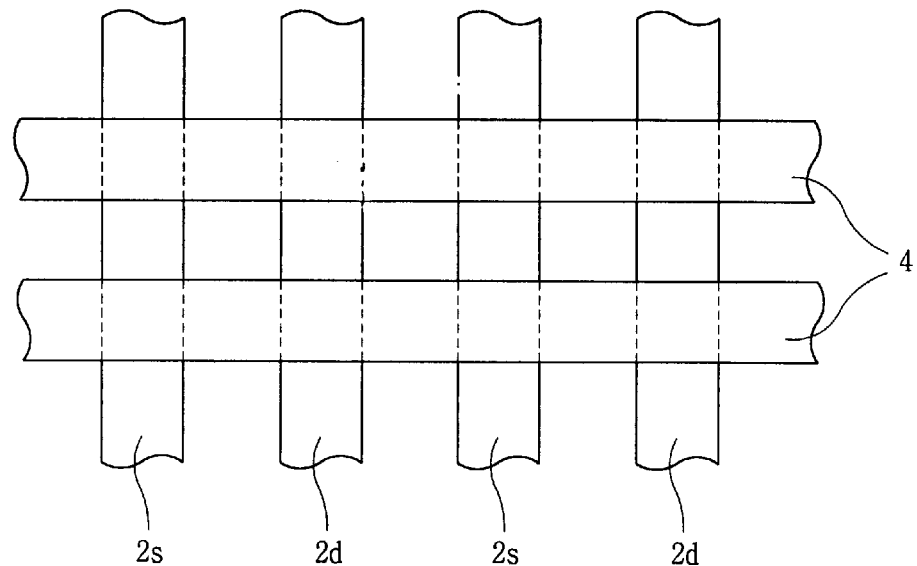
FIG. 1 is a plan view of a layout of a semiconductor memory device according to the conventional art.
Figure 2:
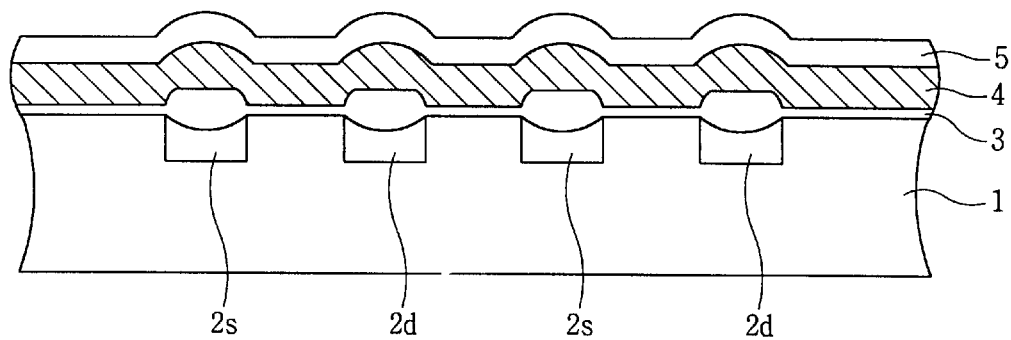
FIG. 2 is a longitudinal cross-sectional view of the semiconductor memory device in FIG. 1 according to the conventional art.
Figure 3:
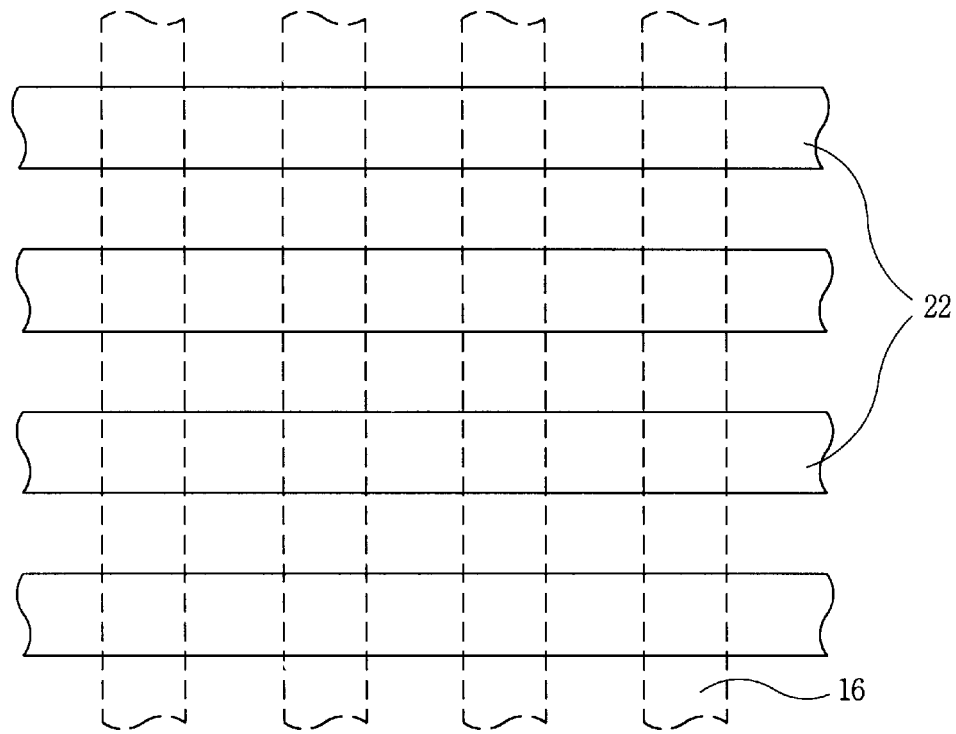
FIG. 3 is a plan view of a semiconductor memory device according to the present invention.

FIG. 3 is a plan view of a semiconductor memory device according to the present invention. As shown in this drawing, bit lines 16 and word lines 22 are formed in the trenches on a semiconductor substrate 11.

Figure 4:
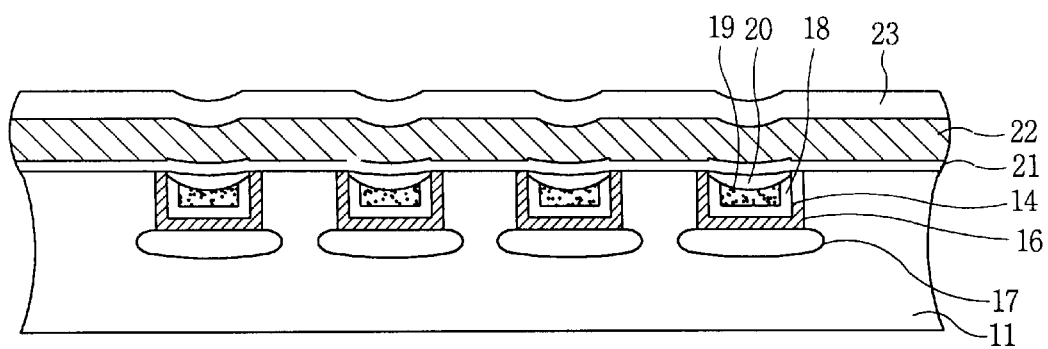
FIG. 4 is a longitudinal cross-sectional view of the semiconductor memory device in FIG. 3 according to the present invention.

FIG. 4 is a longitudinal cross-sectional view of the semiconductor memory device in FIG. 3. As shown in this drawing, the semiconductor memory device includes a first conductive semiconductor substrate 11, a plurality of trenches 14 formed in the semiconductor substrate 11, first impurity areas 16 formed along the outer surfaces of each of the plurality of trenches 14, second impurity areas 17 formed under the outer bottom surfaces of the first impurity areas 16, a first CVD oxide film 18 formed on the inside walls and the inner lower surface in the trenches 14, an SOG (spin on glass) layer 19 filled in the first oxide film 18 in the trench 14, a second CVD oxide film 20 formed on the SOG layer 19, a gate oxide film 21 formed at a regular interval on the semiconductor substrate 11 having the second oxide film 18, and a conductive layer serving as a gate electrode formed on the gate oxide film.

The conductive layer is formed by the sequential deposition of a polysilicon 22 and a polysilicide 23.

FIGS. 5A through 5H show a fabrication method for the semiconductor memory device in FIG. 4, and the fabrication steps will now be described in detail.

Figure 5A:
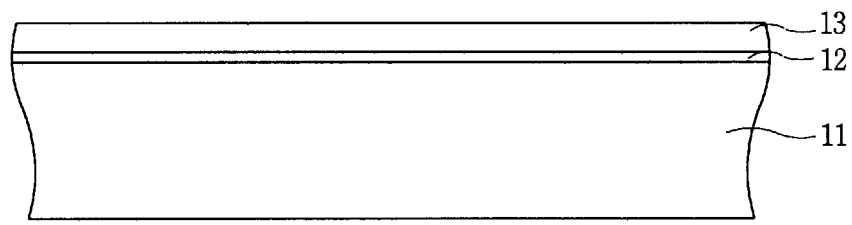
FIGS. 5A through 5H are views showing a fabrication method for a semiconductor memory device according to the present invention.
Figure 5B:
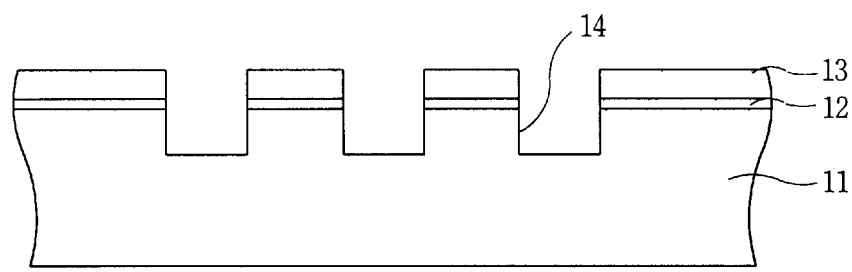

First, as shown in FIGS. 5A and 5B, a relief oxide film 12 which is to serve as an insulating layer is deposited to have a thickness of about 400 Å on the first conductive semiconductor substrate 11, and then a nitride film 13 is deposited to have a thickness of about 1600 Å by a low pressure chemical vapor deposition (LPCVD). Then, by a photolithography process, an insulating layer including the nitride film 13 and the oxide film 12 is patterned to expose a predetermined portion of the semiconductor substrate, and a plurality of trenches 14 are formed by etching the semiconductor substrate 11, using the patterned insulating layer as a mask.

Figure 5C:
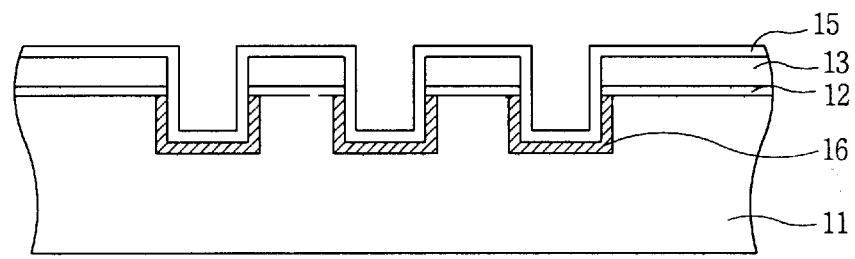
Figure 5D:
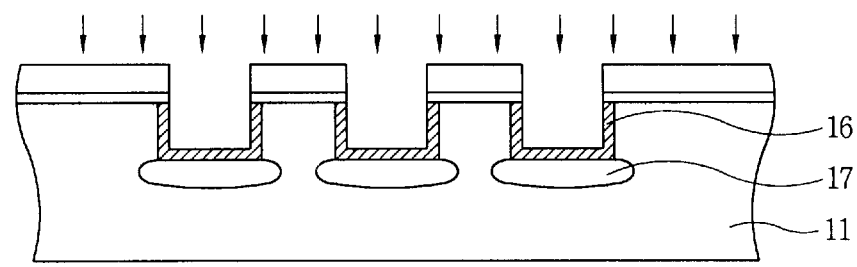

Next, as shown in FIGS. 5C and 5D, after a CVD PSG (phosphorous silicate glass) (n−) 15 is deposited to cover the entire resultant uneven surface formed by the above process, an annealing is performed on the resultant structure at the temperature of about 800~1000° C. so that phosphorus is diffused into the semiconductor substrate 11 to form the first impurity area (n−) 16 along the outer outline of the trenches 14. Then, after the CVD PSG film 15 is stripped, an (n+) ($5 \times 10^{15}$) inpurity is implanted by 0° tilting, using the insulating layer as a mask, so that the second impurity area (n+) 17 is formed beneath the first impurity area (n−) 16.

Figure 5E:
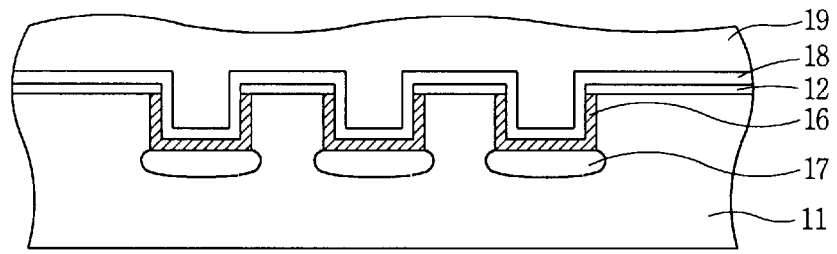
Figure 5F:
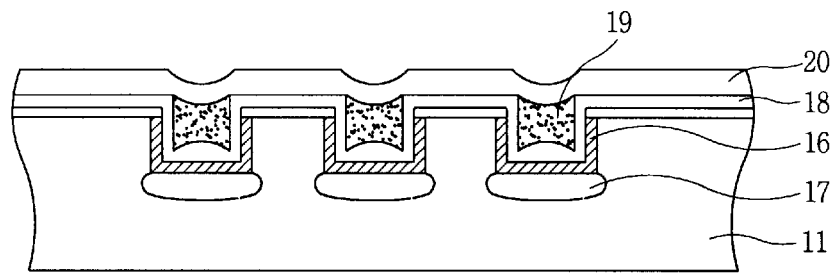

Next, as shown in FIGS. 5E and 5F, after the nitride film 13 which serves as an insulating layer is stripped, a first CVD oxide film 18 is deposited to have a thickness of about 1000 Å to cover the entire resultant surface formed by the above process. By coating the resultant surface with an SOG(spin on glass) for a planarization and curing the same at a temperature of 650° C., an SOG layer 19 is formed in such a manner that the entire surface is covered and the trenches 14 are filled, and then the SOG layer 19 is etched back so that the SOG layer 19 remains on the first oxide film 18 inside the trenches 14. A second CVD film 20 is deposited to have a thickness of 2000 Å on the first CVD film 18, including the upper surface of the remaining SOG layer 19.

Figure 5G:
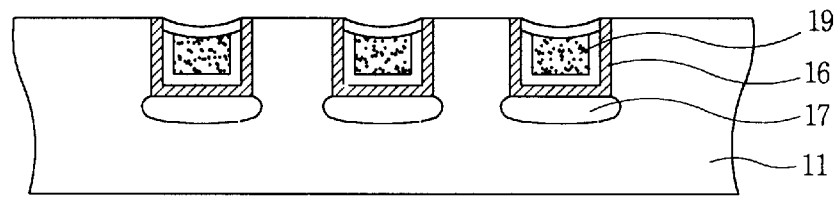
Figure 5H:
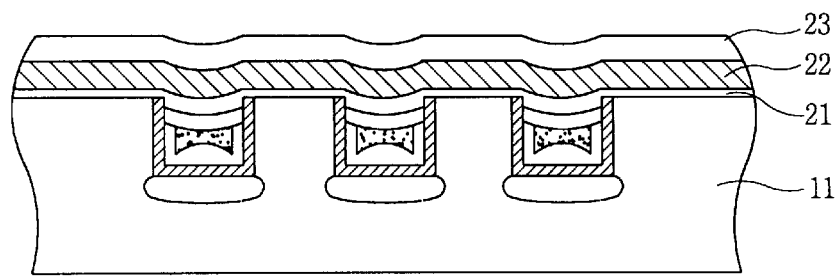

Next, as shown in FIGS. 5G and 5H, the first and second CVD oxide films 18,20 are etched back, and then about 100~150 Å of the gate oxide film 21, about 1000~2500 Å of the polysilicon layer 22 which serves as a gate electrode and about 1000~2000 Å of the polysilicide($WSi_2$) layer 23 are sequentially deposited.

As described above, in the semiconductor memory device according to the present invention, by forming the respective impurity areas(n−,n+) in the semiconductor substrate, the fabrication of the semiconductor memory device having an LDD construction can be achieved.

Therefore, the present invention has the advantages as follows:

The reduction of the size of the semiconductor memory device can be accomplished since the lateral diffusion of impurities is decreased in comparison with the conventional device.

A parasitic capacitance and the delay time of the word lines can be reduced since a thick insulating layer is formed between the polysilicon lines(word line) and the impurity areas.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A semiconductor device, comprising:
   a semiconductor substrate;
   a plurality of trenches each having first and second sidewalls formed in the semiconductor substrate;
   a plurality of first impurity areas, wherein each of the plurality of first impurity areas continuously extend on the first and second sidewalls of one trench of the plurality of trenches to connect and form a unitary region;
   an insulating film filled in each trench;
   a gate insulating film formed at a regular interval on the substrate having the insulating film filled in said each of the trenches; and
   a gate electrode formed on each of the gate insulating films, wherein each of the unitary regions form a one of a single source region and a single drain region for a corresponding gate electrode of the gate electrodes.

2. The semiconductor memory device of claim 1, wherein the gate electrode includes a polysilicon and a polysilicide on the polysilicon.

3. The semiconductor memory device of claim 1, wherein a doping element of the first impurity area is selected among As and Pb.

4. The semiconductor memory device of claim 1, wherein the insulating film includes a first oxide film, an SOG layer on the first oxide film, and a second oxide film on the SOG layer.

5. The semiconductor memory device of claim 4, wherein the SOG layer is surrounded by the first and second oxide films.

6. The semiconductor memory device of claim 1, further comprising a plurality of second impurity areas each formed under a bottom area of a corresponding trench, wherein the first and second impurity areas are adjacent and electrically coupled surrounding the corresponding trench.

7. The semiconductor memory device of claim 6, wherein a concentration of the first impurity area is lower than that of the second impurity area.

8. The semiconductor memory device of claim 6, wherein a doping element of the second impurity area is selected among As and Pb.

9. The semiconductor memory device of claim 6, wherein the first and second impurity areas surrounding the corresponding trench serve as a single bitline and wherein the gate electrodes form word lines.

10. The semiconductor memory device of claim 1, wherein the plurality of trenches are formed along a first direction, the gate insulating film is formed at the regular interval along a second direction, and wherein the second direction is substantially perpendicular to the first direction.

11. The semiconductor device of claim 1, wherein each trench has a bottom connecting the first and second sidewalls, wherein said each unitary region extends under the bottom to connect the first impurity areas continuously extending on the first and second sidewalls, respectively, and wherein the unitary region is "U" shaped.

12. A semiconductor device, comprising:
   a substrate;
   a plurality of recesses formed in the semiconductor substrate;
   a plurality of impurity regions each formed continuously surrounding a first side surface, a second side surface and a bottom surface of a corresponding one of the recesses to serve as one of a single source region and a single drain region;
   an insulating film formed within the recesses;
   gate insulating films formed on the substrate; and
   a gate electrode formed on each of the gate insulating films.

13. The semiconductor device of claim 12, wherein each of the impurity regions comprises:
   a first impurity region formed on an entire surface of the side and bottom surfaces of the recesses; and a second impurity region formed adjacent the first impurity region on the bottom surface, wherein the concentration of the first impurity region is lower than the second impurity region.

14. The semiconductor device of claim 2, wherein the insulating film includes a first oxide film, an SOG layer on the first oxide film, and a second oxide film on the SOG layer.

15. The semiconductor device of claim 12, wherein the plurality of recesses are formed along a first direction, the gate insulating films are formed separated by a prescribed distance along a second direction, and wherein the second direction is substantially perpendicular to the first direction, wherein two consecutive impurity regions of the plurality of impurity regions respectively form a source and a drain for a corresponding gate electrode.

16. A semiconductor memory device, comprising:
a semiconductor substrate;
a plurality of first signal lines formed at regular intervals on the substrate in a first direction;
a plurality of trenches formed in the semiconductor substrate along a second direction substantially perpendicular to the first direction, wherein the trenches form second signal lines, wherein each of the trenches comprises,
impurity areas, wherein each of the impurity ras is formed along all sides and bottom surfaces to surround one of the plurality of trenches, wherein the impurity areas of each of the plurality of trenches form a single one of a single source region and a single drain region, and
an insulating film filled in each trench.

17. The semiconductor memory device of claim 16 wherein each of the plurality of first signal lines comprises:
a gate insulating film formed at regular intervals on the substrate in the first direction on the insulating films filled in the trench; and
a gate electrode formed on each of the gate insulating films.

18. The semiconductor memory device of claim 16, wherein the first and second signal lines are wordlines and bitlines, respectively, and wherein a selected wordline forms a channel in the substrate between two adjacent corresponding trenches that form a pair of bitlines.

19. The semiconductor memory device of claim 16, wherein each of the impurity areas comprises:
first impurity areas formed along said all sides and bottom surfaces of each of the plurality of trenches to form a unitary continuously extending first impurity region; and
second impurity areas formed under the bottom surface of each of the trenches, and wherein each of the insulating films includes a first oxide film, an SOG layer on the first oxide film, and a second oxide film on the SOG layer.

20. The semiconductor memory device of claim 16, wherein said all side surfaces include only a first side and a second side that intersect at the bottom surface.

* * * * *